United States Patent [19]

Abbas et al.

[11] 4,010,482
[45] Mar. 1, 1977

[54] NON-VOLATILE SCHOTTKY BARRIER DIODE MEMORY CELL

[75] Inventors: Shakir Ahmed Abbas, Wappingers Falls; Narasipur Gundappa Anantha, Hopewell Junction; Robert Charles Dockerty, Highland, all of N.Y.

[73] Assignee: International Business Machines Corporation, Armonk, N.Y.

[22] Filed: Dec. 31, 1975

[21] Appl. No.: 645,767

[52] U.S. Cl. .................................. 357/15; 357/23; 357/52; 357/53; 357/59
[51] Int. Cl.² .................. H01L 29/48; H01L 29/56; H01L 29/64; H01L 29/78
[58] Field of Search .................. 357/15, 23, 59, 52, 357/53

[56] References Cited
UNITED STATES PATENTS

| | | | |
|---|---|---|---|
| 3,796,928 | 3/1974 | Doo et al. | 357/59 |
| 3,836,992 | 9/1974 | Abbas et al. | 357/23 |

OTHER PUBLICATIONS

IBM Technical Disclosure Bulletin; by Abbas; vol. 15 No. 6 Nov. 1972 p. 1981.
IBM Technical Disclosure Bulletin; by Freed et al. vol. 15, No. 12 May 1973; pp. 3895-3896.

*Primary Examiner*—Andrew J. James
*Attorney, Agent, or Firm*—James M. Thomson

[57] ABSTRACT

A non-volatile memory cell that includes a Schottky barrier diode, located over a sub-diffused line or region formed within the substrate, acting as the control element. Information is stored in the device by introducing electrons into a nitride-oxide interface located at the perimeter of the Schottky barrier junction. Thus, the injected electrons are subject to trapping in the nitride-oxide layer, causing depletion in the epi region adjoining the diode interface, thereby influencing the current carrying state of the device.

5 Claims, 4 Drawing Figures

NON-VOLATILE SCHOTTKY BARRIER DIODE MEMORY CELL

BACKGROUND OF THE INVENTION

1. Field of the Invention

The present invention relates to a semiconductor memory device, and more particularly to a semiconductor memory device including a Schottky barrier junction oriented over a sub-diffused line, and further including an insulating region proximate the Schottky barrier junction whereby electrons captured in the insulating region cause depletion in the epi region adjoining the diode interface whereby the current carrying state of the device is influenced.

Description of the Prior Art

A need has long existed for semiconductor memory devices which could be manufactured in compact arrays and which would provide memory circuit capability permitting data readout at high speed in a non-volatile, and preferably in a non-destructive fashion.

Various kinds of semiconductor memory devices which are suitable for orientation in arrays exist in the prior art. In particular, it is known that characteristics of certain insulated gate field effect transistors can be altered by the use of insulating material capable of storing or capturing electron charges when a voltage exceeding a certain critical value is applied to the gate. Such devices have been utilized in various configurations as memory elements and have been utilized in various configurations of memory arrays.

However, a need still exists for improved semiconductor memory devices exhibiting the desired characteristics of non-volatility and non-destructive readout capability.

SUMMARY OF THE INVENTION

Accordingly, it is an object of the invention to provide a new and improved semiconductor memory device which is susceptible of use in memory arrays.

It is yet another object of the invention to provide such a semiconductor memory device which is susceptible of high speed readout, is non-volatile, and is susceptible of non-destructive readout.

These and other objects of the invention are attained in a design which utilizes a Schottky barrier diode oriented upon a substrate over a sub-diffused line or region formed within the substrate. A nitride-oxide interface is located at the perimeter of the Schottky barrier junction, and this interface of insulating material exhibits a capability of charge storage, that is, trapping of electrons injected into the insulating material by application of a signal to the memory device. The trapped electrons cause depletion in an epi region surrounding the Schottky barrier junction, thereby influencing the current state of the device and providing a memory capability. When such devices are arranged in a memory array, the array includes only one contact per device whereby a high cell density is possible. Moreover, the cell includes separate read and erase capabilities whereby non-destructive readout is possible, and the devices are otherwise non-volatile.

BRIEF DESCRIPTION OF THE DRAWINGS

The foregoing objects and other features and advantages of the invention are explained in the following description of the invention taken in conjunction with the accompanying drawings wherein.

DETAILED DESCRIPTION OF THE INVENTION

Figures 2, 3:
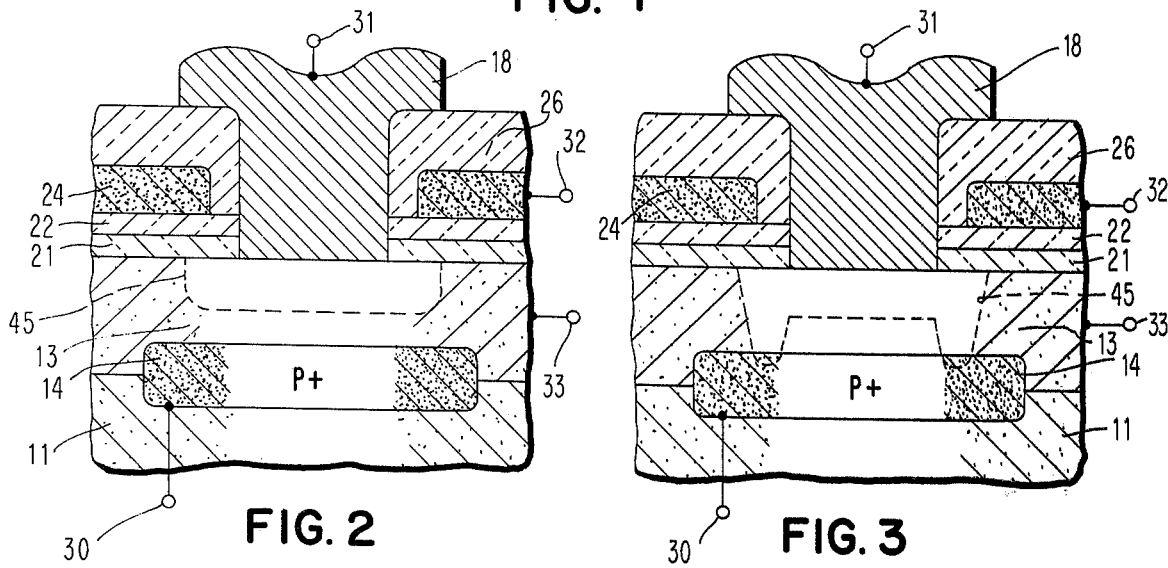
FIG. 2 comprises a view in vertical cross section of a semiconductor memory device designed in accordance with one embodiment of the invention.
FIG. 3 comprises a view in vertical cross section of the device of FIG. 2 in another electrical state.
Figure 4:
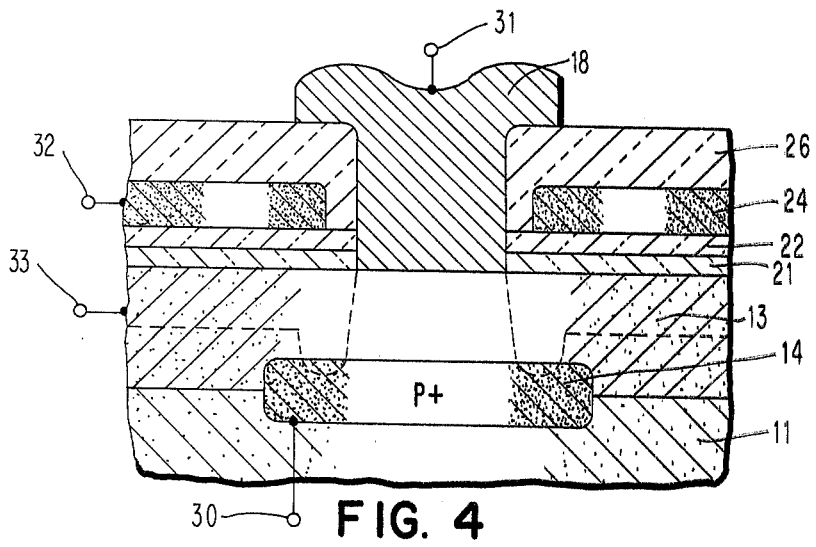
FIG. 4 comprises yet another view in vertical cross section of the device illustrated in FIG. 2 in a further electrical state.

Referring now to the drawings and particularly to FIGS. 2–4, one preferred embodiment of the invention is illustrated comprising a non-volatile semiconductor memory cell. In the embodiment illustrated, the memory cell is generally comprised of an N-type silicon substrate 11 having a specific resistivity of about 0.01 to 1 ohms-centimeter. An N-type silicon epitaxial layer 13 having a thickness of 0.1 to 3 microns and a specific resistivity of 0.1 to 10 ohms-centimeter is provided on the surface of the substrate, in usual fashion. A P-type diffusion 14 is provided within layers 11 and 13, having a thickness of about 0.1 to 3 microns and a resistivity of 0.1 ohms-centimeter. Electrical contact to P+ region 14 established through a P+ reachthrough diffused region and metal electrode. The reachthrough region and electrode are located at the perimeter of an array of memory devices in usual fashion, not illustrated. The electrical contact to region 14 is schematically illustrated by terminal 30 in FIGS. 2–4.

A metal electrode 18 is connected in Schottky contact to the upper surface of epi layer 13. A gating structure is provided about the periphery of electrode 18 generally comprising a layer 21 of silicon oxide having a layer 22 of silicon nitride formed thereon. A layer 24 of polycrystalline silicon is provided upon layer 22. As shown, the periphery of layer 24 is separated from the periphery of electrode 18 by a layer 26 of insulating material, such as silicon dioxide which overlays the upper surface of the device.

Appropriate electrical connections are provided to the various elements of the device by conventional metallization, not illustrated. Thus, a terminal 31 is illustrated in electrical association with the electrode 18, a terminal 32 is illustrated in electrical association with layer 24, a terminal 33 is illustrated in electrical association with layer 13 and as previously mentioned, terminal 30 is illustrated in electrical association with region 14. Contact 33 can be made either at the back of substrate 11 or at the top of epi layer 13. In the latter case, an N+ diffusion is required under the electrode in order to form an ohmic contact to epi layer 13.

The following is a brief outline of the fabrication process. Starting, substrate 11 is oxidized, windows are etched by standard photolithographic methods and P+ regions 14 are formed by diffusion or ion implantation. The oxide layer is then removed and epi layer 13 is grown. The epi layer is oxidized, windows are etched, and P+ reachthrough regions are formed. The oxide layer is removed, oxide layer 21 is grown and nitride layer 22 is deposited. Polysilicon layer 24 is deposited and is doped in situ or by a diffusion or ion implantation process. Windows are etched in polysilicon layer 24 and insulating layer 26 is formed. This step is followed by an anneal in hydrogen. Contact regions are opened to the Schottky diode region, polysilicon layer 24, reachthrough region 15 and epi layer 13 (or substrate 11). Metal is then deposited, etched and the wafer is annealed.

In the operation of the cell illustrated in FIGS. 2–4, information is written into the device by setting terminals 30 and 33 to a 0 potential, and by concurrently applying a large negative voltage to terminal 31 and a large positive voltage to terminal 32. This results in avalanche of the Schottky barrier diode, causing electrons to be injected into the nitride-oxide layer 21, 22 where they are trapped. If the electrons are trapped or stored in the nitride-oxide layer, they tend to deplete epi layer 13 in the fashion illustrated by line 45 in FIG. 3, for example. A read operation then can be achieved by holding terminal 33 at 0 potential, and by applying a negative voltage to terminal 31 and a negative voltage to 32. This causes a substantial current flow from the Schottky diode metal contact to P+ diffusion 14, which does not occur in the absence of stored electrons in the nitride-oxide layer. It should be noted that the Schottky barrier diode does not avalanche in this condition because the voltage at terminal 32 is less than 0. Accordingly, the readout is non-destructive.

Erasure is achieved in the device by maintaining terminals 31 and 33 at 0 potential, and by concurrently applying a negative voltage to terminal 32 and a positive voltage to terminal 30. In this event the voltage applied to terminal 32 tends to deplete the epi layer and holes are injected from the forward biased P+—N junction into the depletion region. The holes are injected into nitrideoxide layer 21, 22 where they neutralize the trapped electrons. In an alternative mode, erasure can be accomplished by maintaining terminals 30, 31 and 33 at a 0 potential and applying a large positive potential to terminal 32. This tends to drive the trapped electrons out of the insulating oxide nitride layer and return the device to the state illustrated in FIG. 2. When a read operation is now performed, a small current flows from Schottky diode electrode 18 to P+ region 14.

Figure 1:
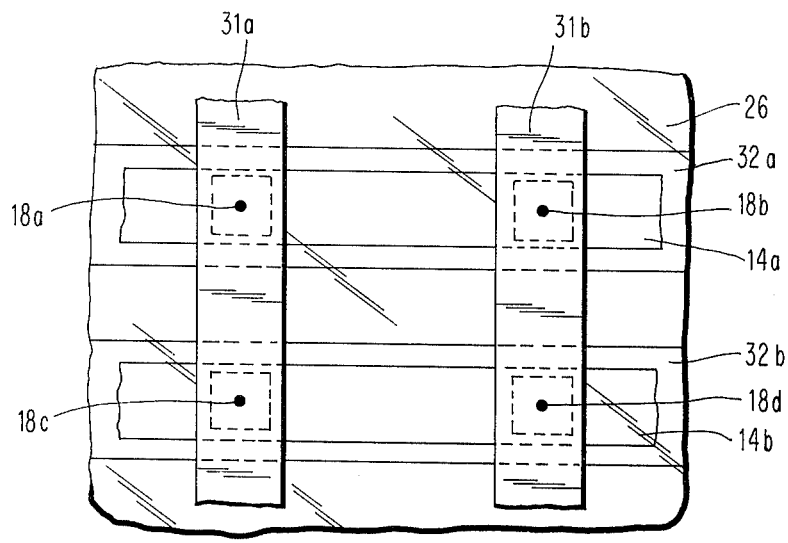
FIG. 1 is a top view of an array utilizing devices designed in accordance with the invention.

The memory cell illustrated in FIGS. 2–4 is particularly susceptible of use in arrays such as that illustrated in FIG. 1 where corresponding elements of FIG. 2 are illustrated with like subscripted numerals. Thus, in FIG. 1 four electrodes 18a–18d are illustrated in association with four separate memory cells. The array is susceptible of X-Y selection since application of a negative voltage to any of terminals 31a or 31b will result in writing of information in the given cell only if the corresponding polysilicon layer is energized by a positive potential via terminal 32a or 32b, respectively. Readout and erasure is accomplished in the same fashion as previously been explained with respect to the FIGS. 2–4 embodiment.

It should be recognized that the foregoing structure provides an improved semiconductor memory element which is of simple structural design and provides enhanced readout capability in that it comprises a nonvolatile cell with non-destructive readout capability.

What is claimed is:

1. A non-volatile memory element comprising a substrate of one conductivity type, a region of opposite conductivity type provided within said substrate having a first electrode in ohmic contact therewith, an epi layer of said first conductivity type formed upon said substrate, a second electrode in contact with said epi layer through a Schottky barrier, a thin layer of insulating material upon said epi layer adjacent to said Schottky barrier, said layer including electron trapping centers and trapped electrons therein when a bias exceeding a critical value is applied across said Schottky barrier, and a layer of conductive material deposited on said layer of insulating material and having a third electrode in ohmic contact therewith.

2. The memory element of claim 1 wherein said substrate is formed of N type material and said region of opposite conductivity type is P+ material.

3. The memory element of claim 2 wherein said thin layer of insulating material is silicon dioxide covered by silicon nitride.

4. The memory element of claim 3 wherein said second electrode is comprised of aluminum.

5. The memory element of claim 3 wherein polysilicon comprises said layer of conductive material deposited on said layer of insulating material.

* * * * *